(12) United States Patent
Kosakai (10) Patent No.: US 6,950,297 B2
(45) Date of Patent: Sep. 27, 2005

(54) ELECTROSTATIC CHUCK AND MANUFACTURING METHOD THEREFOR

(75) Inventor: Mamoru Kosakai, Tokyo (JP)

(73) Assignee: Sumitomo Osaka Cement Co., Ltd. (JP)

( * ) Notice: Subject to any disclaimer, the term of this patent is extended or adjusted under 35 U.S.C. 154(b) by 216 days.

(21) Appl. No.: 10/294,837

(22) Filed: Nov. 12, 2002

(65) Prior Publication Data

US 2003/0123213 A1 Jul. 3, 2003

(30) Foreign Application Priority Data

Nov. 14, 2001 (JP) ........................................ 2001-348985

(51) Int. Cl.$^7$ .............................................. H02N 13/00
(52) U.S. Cl. ...................................................... 361/234
(58) Field of Search ................................ 361/234, 233; 501/88, 89; 279/128

(56) References Cited

U.S. PATENT DOCUMENTS

| | | | | |
|---|---|---|---|---|
| 4,859,638 A | * | 8/1989 | Wada et al. | 501/88 |
| 5,785,922 A | * | 7/1998 | Higuchi et al. | 264/682 |
| 6,108,189 A | * | 8/2000 | Weldon et al. | 361/234 |
| 6,310,755 B1 | * | 10/2001 | Kholodenko et al. | 361/234 |
| 6,462,928 B1 | * | 10/2002 | Shamouilian et al. | 361/234 |
| 6,603,651 B2 | * | 8/2003 | Kosakai | 361/234 |
| 2002/0006678 A1 | | 1/2002 | Inazumachi et al. | |
| 2002/0008015 A1 | | 1/2002 | Kosakai et al. | |
| 2002/0036373 A1 | | 3/2002 | Kosakai | |
| 2002/0044404 A1 | | 4/2002 | Kosakai | |

FOREIGN PATENT DOCUMENTS

| | | |
|---|---|---|
| JP | 9-283606 | 10/1997 |
| JP | 9-283607 | 10/1997 |
| JP | 2000-2775592 | 10/2000 |
| JP | 2000-327424 | 11/2000 |
| JP | 2001-85505 | 3/2001 |
| JP | 2001-287982 | 10/2001 |
| JP | 2001-308165 | 11/2001 |
| JP | 2001-313331 | 11/2001 |
| JP | 2001-338970 | 12/2001 |
| JP | 2001-341043 | 12/2001 |
| JP | 2001-351966 | 12/2001 |
| JP | 2001-351969 | 12/2001 |
| JP | 2002-44971 | 2/2002 |
| JP | 2002-151580 | 5/2002 |
| JP | 2002-184851 | 6/2002 |

OTHER PUBLICATIONS

*Sugino Machine Limited* Catalogue, Copyright© 2001–2004, pages displaying *Wet Type Atomization Unit* of a Ulthimaizer System and *Ulthimaizer System*.

* cited by examiner

Primary Examiner—Brian Sircus
Assistant Examiner—Zeev Kitov
(74) Attorney, Agent, or Firm—Ostrolenk, Faber, Gerb & Soffen, LLP (57) ABSTRACT

An electrostatic chuck of the invention comprising; a first insulating member whose upper surface serves as a mounting surface on which a plate specimen is mounted, a second insulating member which is positioned facing a lower surface side of the first insulating member, and an internal electrode located between the first insulating member and the second insulating member, wherein the first insulating member is a composite ceramic having as its main constituents 1 wt % to 4 wt % of silicon carbide, and aluminum oxide, with a volume resistivity value in a temperature range of −200° C. to 200° C., of $1 \times 10^{14}$ Ωcm to $1 \times 10^{16}$ Ωcm.

10 Claims, 3 Drawing Sheets

ELECTROSTATIC CHUCK AND MANUFACTURING METHOD THEREFOR

BACKGROUND OF THE INVENTION

1. Field of the Invention

The present invention relates to an electrostatic chuck and a manufacturing method therefor. In particular, the invention relates to an electrostatic chuck suited to holding a plate specimen, such as a semiconductor wafer, a metallic wafer, a glass substrate or the like, using an electrostatic force, which is used in production lines for semiconductor devices, liquid crystal devices, hybrid ICs and the like, and a manufacturing method therefor.

2. Description of the Related Art

Heretofore, in production lines for semiconductor devices, liquid crystal devices, hybrid ICs and the like, in order to hold a plate specimen, for instance a semiconductor wafer such as a silicon wafer, a metallic wafer such as a thin copper plate, a glass plate or the like, for example a vacuum chuck that can suck and hold such plate specimens physically using vacuum force, or a clamp that can hold these plate specimens mechanically has been used.

However, in a conventional vacuum chuck, since under vacuum conditions there is no pressure difference between the external atmosphere and the vacuum chuck, there is a problem in that a plate specimen cannot be held. Furthermore, in a conventional clamp there are problems such as; the location where the clamp makes contact with a plate specimen cannot be used for a device, partial distortion occurs in the plate specimen, and stray particles are produced by raising and lowering of the clamp.

Therefore, in order to solve the above problems, an electrostatic chuck is proposed that enables a plate specimen to be held by using electrostatic force.

This electrostatic chuck is constructed with a circular thin internal electrode and a pair of insulating members positioned on opposite sides of this internal electrode as its main components. A plate specimen is mounted onto the mounting surface of one of the pair of insulating members, and a prescribed DC voltage is applied to the internal electrode, thereby enabling the plate specimen to be held on the mounting surface using electrostatic force.

There are two types of this electrostatic chuck, depending on the difference of electrostatic force.

One type is an electrostatic chuck using the Johnson-Rahbek effect (referred to hereunder as a Johnson-Rahbek type electrostatic chuck) as an electrostatic force, and the other type is an electrostatic chuck using the Coulomb force (referred to hereunder as a Coulomb type electrostatic chuck) as an electrostatic force.

In the abovementioned Johnson-Rahbek type electrostatic chuck, there are problems in that leakage current is great, the electrostatic attraction force varies depending on the type of plate specimen, and detachment of plate specimens is not good after removing the DC voltage.

On the other hand, the Coulomb type electrostatic chuck has characteristics in that the electrostatic attraction force hardly varies regardless of the type of plate specimen, and disattachment of plate specimens is good after the DC voltage is removed. However, in the case of executing plasma cleaning and the like, since charging up of the attachment surface occurs easily, large plasma marks accompanying this charging up are likely to occur. Therefore, there is a problem in that resistance to corrosive gases is not sufficient.

SUMMARY OF THE INVENTION

The present invention is to solve the above problems, with an object of providing an electrostatic chuck, and a manufacturing method therefor, in which leakage current is small, there is no concern about the electrostatic attraction force varying depending on the type of plate specimen mounted, disattachment of plate specimens is good after the DC voltage is removed, and furthermore plasma resistance is improved significantly and resistance to corrosive gases is good.

As a result of various research into solving the problems pertaining to the above-described conventional technology, the inventors discovered that by forming at least an insulating member on the side where a plate specimen is mounted, using a specific composite ceramic having silicon carbide and aluminum oxide as its main constituents, and setting the volume resistivity value to be within a specified range within a temperature range of −200° C. to 200° C., the above-described problems can be solved effectively, thereby arriving at the electrostatic chuck and the manufacturing method therefor of the present invention.

That is, an electrostatic chuck according to a first aspect of the present invention comprises: a first insulating member whose one principal plane serves as a mounting surface on which a plate specimen is mounted; a second insulating member, which is positioned facing an other principal plane of the first insulating member; and an internal electrode located between the first insulating member and the second insulating member, wherein the first insulating member is formed from a composite ceramic having as its main constituents 1 wt % to 4 wt % of silicon carbide (SiC), and aluminum oxide ($Al_2O_3$), with a volume resistivity value in a temperature range of −200° C. to 200° C., of $1 \times 10^{14}$ Ωcm to $1 \times 10^{16}$ Ωcm.

In this electrostatic chuck, the first insulating member is a composite ceramic having as its main constituents 1 wt % to 4 wt % of silicon carbide, and aluminum oxide, with a volume resistivity value in the temperature range of −200° C. to 200° C., of $1 \times 10^{14}$ Ωcm to $1 \times 10^{16}$ Ωcm. As a result, of the electrostatic forces for attracting and holding a plate specimen, the Coulomb force is dominant over the Johnson-Rahbek effect, charging up of the attachment surface does not occur easily when plasma processing is performed, plasma resistance is improved significantly, and resistance to corrosive gases is also improved.

An electrostatic chuck according to another aspect of the present invention comprises: a first insulating member whose one principal plane serves as a mounting surface on which a plate specimen is mounted; a second insulating member, which is positioned facing an other principal plane of the first insulating member; and an internal electrode located between the first insulating member and the second insulating member, wherein the first insulating member is formed from a composite ceramic having as its main constituents silicon carbide, on the surface of which an insulating material is formed, and aluminum oxide, with a volume resistivity value in a temperature range of −200° C. to 200° C., of $1 \times 10^{14}$ Ωcm to $1 \times 10^{16}$ Ωcm.

In this electrostatic chuck, the first insulating member is a composite ceramic having as its main constituents silicon carbide, on the surface of which an insulating material is formed, and aluminum oxide, with a volume resistivity value in the temperature range of −200° C. to 200° C., of $10 \times 10^{14}$ Ωcm to $1 \times 10^{16}$ Ωcm. As a result, of the electrostatic forces for attracting and holding a plate specimen, the Coulomb force is dominant over the Johnson-Rahbek effect, charging up of the attachment surface does not occur easily when plasma processing is performed, plasma resistance is improved significantly, and resistance to corrosive gases is also improved.

In these electrostatic chucks, the second insulating member may be of any material that has sufficient insulation, excellent mechanical strength, plasma resistance, and heat resistance, and may have a different structure from the first insulating member. However, considering that it has the same characteristics as the first insulating member, and that it is possible to simplify the electrostatic chuck manufacturing process by manufacturing it at the same time, the second insulating member is formed preferably from a composite ceramic having the same structure as the first insulating member.

As a result, the second insulating member can have excellent corrosion resistance to corrosive gases such as halogen gas, plasma resistance to plasma, high strength and hardness, and have excellent heat resistance and thermal shock resistance.

In these electrostatic chucks, a composite ceramic having silicon carbide (SiC) and aluminum oxide ($Al_2O_3$) as its main constituents refers to a composite ceramic containing 98 wt % or more of a combination of silicon carbide and aluminum oxide.

The insulating material formed on the surface of the silicon carbide is preferably a mullite based material.

The thickness of this mullite based material is preferably 0.2 $\mu$m or less.

Here, mullite based material refers to mullite ($3Al_2O_3.2SiO_2$) in general terms and includes alternatives such as a solid solution or a glassy composite of aluminum oxide and mullite, or a solid solution or glassy composite of silicon dioxide ($SiO_2$) and mullite.

Preferably an average particle diameter of aluminum oxide particles in the composite ceramic is 2 $\mu$m or less.

The reason is that if the average particle diameter of the aluminum oxide particles exceeds 2 $\mu$m, etching of the first insulating member by plasma occurs easily, forming sputter marks on the mounting surface of the first insulating member, leading to a high degree of surface roughness, and thus lowering the electrostatic attraction force.

Preferably an average particle diameter of silicon carbide particles in the composite ceramic is 1 $\mu$m or less, and more preferably 0.5 $\mu$m or less.

The reason is that if the average particle diameter of the silicon carbide particles exceeds 1 $\mu$m, the effect of improving the strength of the first insulating member by adding silicon carbide particles is reduced. Furthermore the electric field at the time of plasma exposure is likely to concentrate in the area of the silicon carbide particles, and hence there is concern about damage in the vicinity of the silicon carbide particles.

Preferably at least some of the silicon carbide particles in the composite ceramic are inside aluminum oxide particles.

The reason is that if at least some of the silicon carbide particles are inside the aluminum oxide particles, the insulation of the first insulating member is increased, growth of the aluminum oxide particles is suppressed, the surface becomes even with fewer pores, and even if pores exist their diameters are small, hence favorable surface conditions can be obtained.

A manufacturing method for an electrostatic chuck of the present invention is a manufacturing method for an electrostatic chuck comprising a first insulating member whose one principal surface serves as a mounting surface on which a plate specimen is mounted, a second insulating member, which is positioned facing an other principal plane of the first insulating member, and an internal electrode located between the first insulating member and the second insulating member, wherein a step for manufacturing the first insulating member, the second insulating member, or both, has a mixing step for weighing prescribed amounts of silicon carbide powder and aluminum oxide powder and mixing them using a high pressure homogenization method, and a pressurized calcination step for calcinating the obtained mixed powder under pressure to form a composite ceramic.

In this manufacturing method for an electrostatic chuck, by weighing prescribed amounts of silicon carbide powder and aluminum oxide powder and mixing them using a high pressure homogenization method, even if there is only a small amount of silicon carbide powder, homogeneous dispersion is performed easily, thus enabling a mixed powder with an excellent homogeneous composition to be obtained. By so doing, if this mixed powder is pressurized and calcinated, it is possible to obtain a composite ceramic that has no abnormal particle growth, no intermixed impurities such as carbon or a range of metallic impurities caused by a dispersing agent, and has an excellent homogeneous composition.

This composite ceramic has excellent characteristics of; corrosion resistance to corrosive gases such as halogen, plasma resistance to plasma, mechanical strength, hardness, heat resistance, thermal shock resistance and the like.

It is preferable to form a film coating containing silicon dioxide on the surface of the silicon carbide powder by heat treating in an oxidizing atmosphere.

By forming a film coating containing silicon dioxide on the surface, the surface of the silicon carbide powder, which is intrinsically a semiconductor, is covered by silicon dioxide, which is an insulator, so that the insulation of the composite ceramic is increased.

DETAILED DESCRIPTION OF THE INVENTION

Embodiments of an electrostatic chuck and manufacturing methods therefor according to the present invention are described below.

Figure 1:
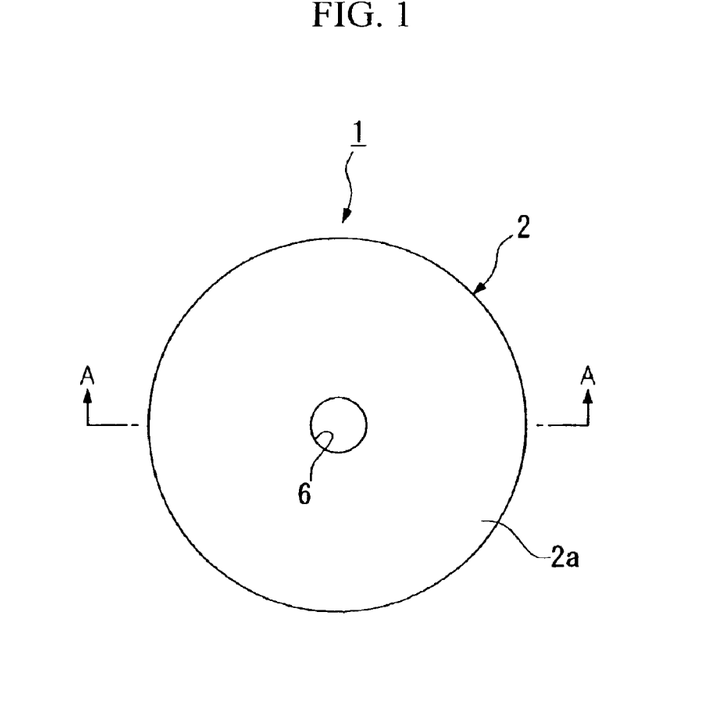
FIG. 1 is a plan view showing an electrostatic chuck of a first embodiment of the present invention.
Figure 2:
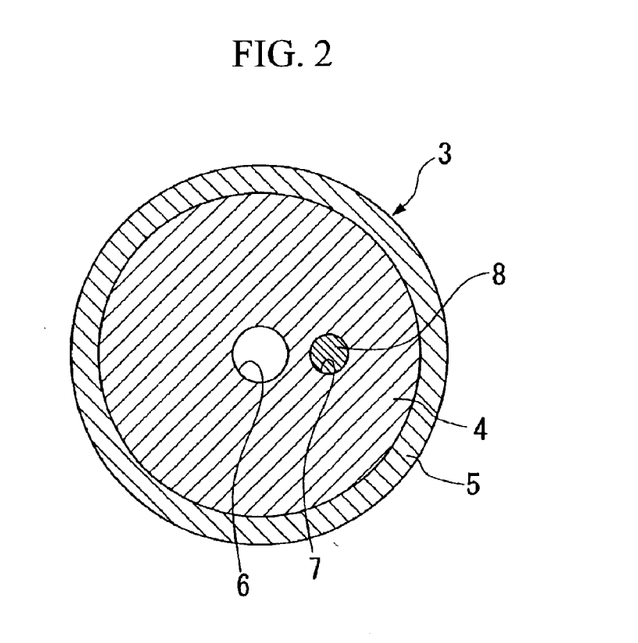
FIG. 2 is a lateral cross-sectional view showing the electrostatic chuck of the first embodiment of the present invention.
Figure 3:
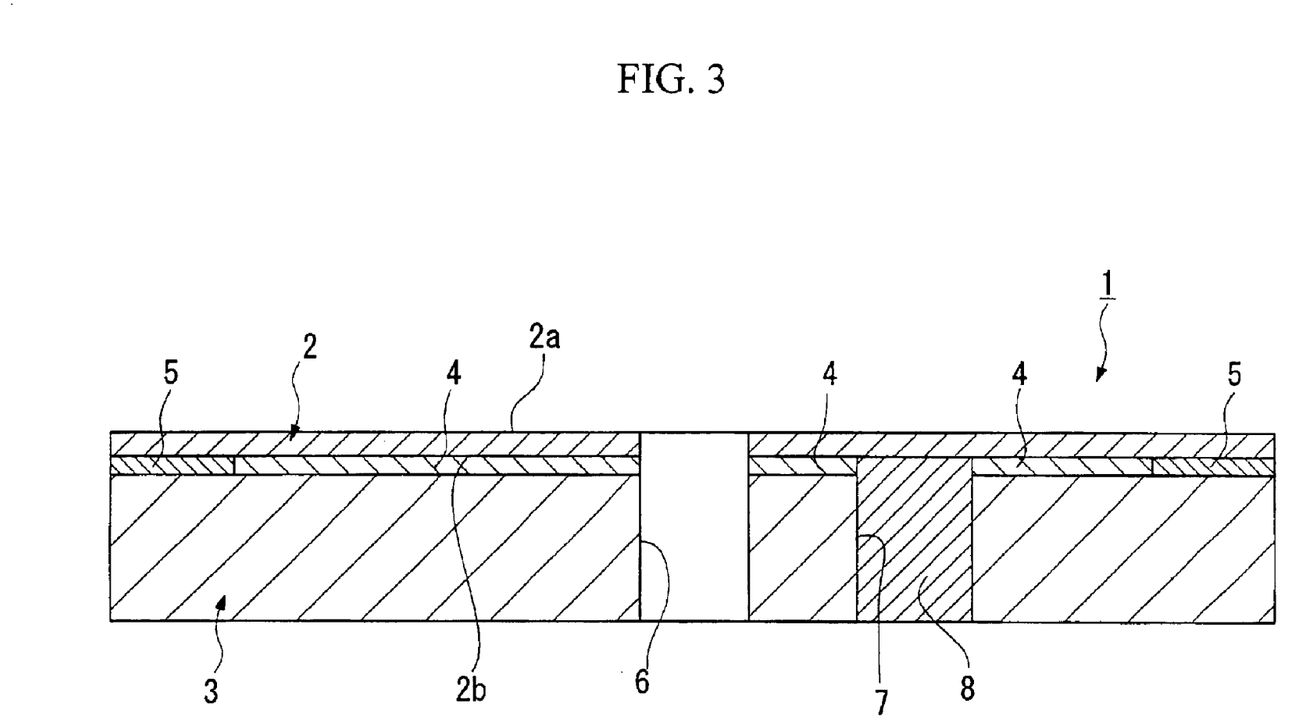
FIG. 3 is a cross-sectional view along line A—A of FIG. 1.

Here, in order to better understand the gist of the invention, the embodiments are described specifically, but the present invention is not limited to these, unless specified.
First Embodiment FIG. 1 is a plan view showing an electrostatic chuck of a first embodiment of the present invention, being an example of a circular electrostatic chuck, FIG. 2 is a lateral cross-sectional view of the same, and FIG. 3 is a cross-sectional view along line A—A of FIG. 1.

This electrostatic chuck 1 is constructed with, as its main components; a first insulating member 2 whose upper surface (one principal plane) serves as a mounting surface 2a on which is mounted a plate specimen such as a semiconductor wafer, a metal wafer, a glass substrate or the like, a second insulating member 3, which is positioned facing a lower surface (other principal plane) side of the first insulating member 2, and an internal electrode 4 located between the first insulating member 2 and the second insulating member 3.

The first insulating member 2 and the second insulating member 3 are joined airtightly via the internal electrode 4 and an insulating joining layer 5 provided on a region between them and outside of the internal electrode 4.

A through hole 6 is formed passing through the first insulating member 2, the second insulating member 3 and the internal electrode 4, for inserting a pushing member (omitted in the figure) for pushing a plate specimen from below in order to detach the electrostatically attached plate specimen.

A through hole 7 is formed passing through the second insulating member 3 and the internal electrode 4 in a different location from the through hole 6, and an electrode 8 is inserted into this through hole 7 for applying a DC voltage to the internal electrode 4, and the top section of this electrode 8 is joined and electrically connected to the internal electrode 4.

The first insulating member 2 is formed from a composite ceramic having as its main constituents 1 wt % to 4 wt %, preferably 1.2 wt % to 3.9 wt % of silicon carbide, and aluminum oxide. The surface roughness Ra of the mounting surface 2a of the first insulating member 2, on which a plate specimen is mounted, is 0.1S or less.

Considering that the second insulating member 3 has the same characteristics as the first insulating member 2, and that it can be manufactured at the same time as the first insulating member 2, it is preferable to form it from a composite ceramic having the same structure as the first insulating member 2.

The average particle diameter of the aluminum oxide particles in this composite ceramic is 2 $\mu$m or less, and the average particle diameter of the silicon carbide particles is 1 $\mu$m or less, and preferably 0.5 $\mu$m or less.

In this composite ceramic, it is desirable that at least some of the silicon carbide particles are inside the aluminum oxide particles. Furthermore, it is desirable that the content of metallic impurities other than aluminum (Al) and silicon (Si) is 0.1 wt % or less.

Small amounts of impurities in the composite ceramic are permissible. However, especially in the case where a plate specimen is used in a manufacturing process for semiconductor devices, if there is an impurity such as a transition metal element, alkali metal or the like, there is concern about lowering the life time and gate voltage in the manufacturing process for semiconductor devices, caused by the impurity. Furthermore, if the content of metallic impurities other than aluminum and silicon exceeds 0.1 wt %, the possibility of contaminating a plate specimen such as a wafer increases, and also the temperature dependency of electrical resistance of the first insulating member 2 increases.

The volume resistivity value of the first insulating member 2, in the temperature range of −200° C. to 200° C., is $1\times10^{14}$ $\Omega$cm to $1\times10^{16}$ $\Omega$cm.

In this temperature range, the Coulomb force is the dominant electrostatic force exhibited, the temperature dependency of the volume resistivity value (or electrical conductivity) is low. Furthermore, corrosion resistance to corrosive gases such as halogen, and plasma resistance to plasma generated, are excellent, mechanical strength and hardness are high, and heat resistance and thermal shock resistance are excellent.

Moreover, the second insulating member 3 has the same structure as the first insulating member 2, so that corrosion resistance to corrosive gases such as halogen, and plasma resistance to plasma generated, are excellent, mechanical strength and hardness are high, and heat resistance and thermal shock resistance are excellent.

As described above, this electrostatic chuck 1 is constructed such that by mounting a plate specimen such as a semiconductor wafer, a metal wafer, a glass substrate or the like on the mounting surface 2a of the first insulating member 2, and applying a prescribed DC voltage to the internal electrode 4, it is possible to hold the plate specimen by using the Coulomb force.

Next is a description of a manufacturing method for the electrostatic chuck 1 of the present embodiment.

Here, firstly, a manufacturing method for the first insulating member 2 and the second insulating member 3 will be described, and next, a manufacturing method for the electrostatic chuck 1 using the obtained first insulating member 2 and second insulating member 3 will be described.

(1) Manufacturing the First Insulating Member 2 and the Second Insulating Member 3

When manufacturing the first insulating member 2 and the second insulating member 3, it is preferable to use a silicon carbide powder whose average particle diameter is 0.5 $\mu$m or less, as the base powder for the silicon carbide particles.

In a composite ceramic manufactured using a silicon carbide powder whose average particle diameter exceeds 0.5 $\mu$m, the average particle diameter of the silicon carbide particles exceeds 1 $\mu$m, so that the effect of improving mechanical strength of the first insulating member 2 and the second insulating member 3 by adding silicon carbide particles is reduced.

Furthermore, when a first insulating member 2 formed from a composite ceramic manufactured using a silicon carbide powder whose average particle diameter exceeds 0.5 $\mu$m is exposed to plasma, an electric field is concentrated on the area of the silicon carbide particles, being a semiconductor, so that it can easily become badly damaged. Therefore, there is concern about a reduction in the electrostatic attraction force after plasma damage.

Moreover, the smaller the average particle diameter of the silicon carbide powder, the more easily the silicon carbide particles are formed inside the aluminum oxide particles in the composite ceramic.

A silicon carbide powder used as a raw material of the first insulating member 2 is preferably a silicon carbide powder manufactured by using a plasma CVD method. In particular this is preferably an ultrafine silicon carbide powder whose average particle diameter is 0.1 $\mu$m or less, which is manufactured by introducing a raw material gas containing a silane compound, or silicon halide and hydrocarbon, into a plasma in a non-oxidizing atmosphere for a gas phase reaction, while maintaining the pressure of the reaction system in a range from less than one atmosphere to $1.33\times10$ Pa (0.1Torr).

This ultrafine silicon carbide powder has excellent characteristics in that it has excellent sintering properties and high purity, that dispersion when molding is good because its particles are spherical, and that silicon carbide particles are easily formed inside the aluminum oxide particles in the obtained composite ceramic.

Furthermore, it is preferable to use an aluminum oxide powder whose average particle diameter is 1 μm or less as a base powder for the aluminum oxide particles, for the following reason.

In a composite ceramic manufactured using an aluminum oxide powder whose average particle diameter exceeds 1 μm, the average particle diameter of the aluminum oxide particles in the composite ceramic exceeds 2 μm, the first insulating member 2 is easily etched by plasma, and sputter marks are formed on the mounting surface 2a on which a plate specimen of the first insulating member 2 is mounted, leading to a high degree of surface roughness. Hence there is concern about lowering the electrostatic attraction force of the electrostatic chuck 1.

Moreover, the smaller the average particle diameter of the aluminum oxide powder, the more easily silicon carbide particles are formed inside the aluminum oxide particles in a composite ceramic.

Next, the abovementioned silicon carbide powder and aluminum oxide powder constituents are weighed and mixed so as to have a proportion of 1 to 4 wt % of silicon carbide and 99 to 96 wt % of aluminum oxide. Since the volume resistivity value of the composite ceramic obtained is influenced by the average particle diameter of the silicon carbide powder and its dispersion state, it is preferable to determine the blending rate of silicon carbide powder and aluminum oxide powder, and the dispersion state, in advance experimentally so as to obtain a composite ceramic in which the desired volume resistivity value, that is the volume resistivity value in the temperature range of $-200°$ C. to $200°$ C., is $1 \times 10^{14}$ Ωcm to $1 \times 10^{16}$ Ωcm.

When mixing, it is preferable to use a high pressure homogenization method, i.e., so called "Jet-stream mixing method". At this time, it is permissible for a small amount of impurities such as a dispersing agent to be intermixed. However, it is desirable to mix silicon carbide powder and aluminum oxide powder such that the content of metallic impurities other than aluminum and silicon is 0.1 wt % or less.

Here, a high pressure homogenization method refers to a method in which particles accelerated by high pressure are collided with each other to disintegrate and disperse them. By employing this high pressure homogenization method, homogeneous dispersion becomes straightforward by adding only a small amount of dispersing agent, or without adding a dispersing agent, and no coarse particles are created. Furthermore it is possible to reduce the intermixture of impurities, for example carbon and various types of metallic impurities caused by the dispersing agent, and it is possible to produce a composite ceramic whose volume resistivity value in the temperature range of $-200°$ C. to $200°$ C., is $1 \times 10^{14}$ Ωcm to $1 \times 10^{16}$ Ωcm, easily and effectively. The pressure when particles are accelerated is preferably $1.01 \times 10^8$ Pa (1000 atmospheres) to $2.02 \times 10^8$ Pa (2000 atmospheres). If less than $1.01 \times 10^8$ Pa (1000 atmospheres), then there is a possibility that homogeneous dispersion becomes difficult, while if exceeding $2.02 \times 10^8$ Pa (2000 atmospheres) then particles coalesce easily, which is undesirable, although the reason for this coalescing is not always clear.

Next, this mixed powder is molded by a known molding method to manufacture a circular compact. Then, the obtained compact is preferably degreased. It is desirable to degrease it in an argon (Ar) atmosphere at $600°$ C. or lower, or in an air atmosphere at $300°$ C. or lower.

By degreasing under such conditions, it is possible to prevent oxidation of the silicon carbide, and also degreasing can be performed effectively.

Next, after completing degreasing the compact is calcinated under prescribed pressure conditions by using, for example, a hot isostatic pressing (HIP) method or the like.

The pressure is not limited specifically, and may be set between 5 to 40 MPa for example. The reason is that if the pressure is lower than 5 MPa, it is difficult to obtain a composite ceramic with sufficient sintered body density, and it is difficult to obtain a composite ceramic whose volume resistivity value in the temperature range of $-200°$ C. to $200°$ C., is $1 \times 10^{14}$ Ωcm to $1 \times 10^{16}$ Ωcm. On the other hand, if the pressure exceeds 40MPa, a jig made from graphite or the like would be deformed and worn out, which is undesirable.

The temperature at the time of calcination is preferably 1700 to $1850°$ C. The reason is that if the calcination temperature is lower than $1700°$ C. then sintering does not proceed sufficiently, so that a rough structure is obtained rather than a thick composite ceramic. On the other hand, if it exceeds $1850°$ C. then the sintering proceeds too much, and the obtained sintered body is fractured, or abnormal particle growth occurs easily.

Furthermore, the atmosphere at the time of calcination is preferably a non-oxidizing atmosphere such as an argon (Ar) atmosphere, a nitrogen ($N_2$) atmosphere or the like, which can prevent oxidization of the silicon carbide.

Finally, the through hole 6 is formed by machining at a predetermined location on one composite ceramic manufactured as above, to make the first insulating member 2. Furthermore, the through holes 6 and 7 are formed by machining at predetermined locations on another composite ceramic manufactured as above, to make the second insulating member 3.

Moreover, either one of the surfaces of the first insulating member 2 is polished by using a normal polishing method so as to have a surface roughness Ra of, for example, 0.1S or less.

Here, the locations of the through holes 6 and 7 are determined such that when the first insulating member 2 and the second insulating member 3 are superposed, the through holes 6 formed in both become one through hole.

(2) Manufacturing the Electrostatic Chuck 1

By coating a region (region within a prescribed radius from the center excluding the through holes 6 and 7) on the surface of the second insulating member 3 manufactured as above, where an internal electrode is formed with conductive material, a conductive material layer is formed, which eventually serves as the internal electrode 4, and by coating an annular region on the surface of this second insulating member 3, which is outside the region where the conductive material layer is formed, with an insulating material, an insulation material layer is formed, which eventually serves as the insulating joining layer 5.

An example of this conductive material is a mixed powder of conductive ceramic powder such as tantalum carbide, titanium nitride or the like, and an aluminum oxide and silicon dioxide based glass powder. Furthermore, an example of the above insulating material is various types of insulating glass powder, such as an aluminum oxide and silicon dioxide based glass or the like.

Next, the first insulating member 2 and the second insulating member 3 are superposed via the conductive material layer and the insulation material layer such that the through holes 6 of the insulating members 2 and 3 are in the same location. Then by heat treating under pressure, the conductive material layer and the insulation material layer are joined. At this time, the internal electrode 4 is formed from the conductive material layer, and also the insulating joining layer 5 is formed from the insulation material layer, so that the first insulating member 2 and the second insulating member 3 are joined airtightly via the internal electrode 4 and the insulating joining layer 5.

Then, the electrode 8 formed from a conductive ceramic such as tantalum carbide or titanium nitride is inserted into the through holes 7 of the second insulating member 3 and the internal electrode 4, and the upper end of the electrode 8 and the internal electrode 4 are joined electrically via a brazing filler metal such as an activated metal or silver solder.

As described above, according to the electrostatic chuck 1 of the present embodiment, the first insulating member 2 on which a plate specimen is mounted is formed from a composite ceramic having as its main constituents 1 wt % to 4 wt % of silicon carbide, and aluminum oxide, with a volume resistivity value in the temperature range of −200° C. to 200° C., of $1\times10^{14}$ Ωcm to $1\times10^{16}$ Ωcm. Therefore, of the electrostatic forces exhibited when a DC voltage is applied to the internal electrode 4, the Coulomb force is dominant over the Johnson-Rahbek effect, so that leakage current can be reduced, the electrostatic attraction force can be stabilized regardless of the type of a plate specimen, and the plate specimen can be deattached easily after the DC voltage is removed. Furthermore, it is possible to improve plasma resistance and corrosion resistance significantly.

Moreover, since the surface roughness Ra of the mounting surface 2a of the first insulating member 2 is 0.1S or less, it is possible to increase the hardness and mechanical strength of the second insulating member 3. Furthermore, it is possible to reduce the generation of stray particles from the first insulating member 2 and the second insulating member 3, and it is possible to prevent contamination of a plate specimen such as a semiconductor wafer or the like.

Moreover, in addition to the first insulating member 2, the second insulating member 3 is formed from a composite ceramic having as its main constituents 1 wt % to 4 wt % of silicon carbide, and aluminum oxide, with a volume resistivity value in the temperature range of −200° C. to 200° C., of $1\times10^{14}$ Ωcm to $1\times10^{16}$ Ωcm. Therefore, it is possible to make the first insulating member 2 and the second insulating member 3 such that the temperature dependency of electrical conductivity is low, corrosion resistance to halogens is excellent, furthermore heat resistance and thermal shock resistance are excellent, and there is no danger of damage by thermal stress when used under high temperature.

Furthermore, when the average particle diameter of the silicon carbide contained in the composite ceramic constituting the first insulating member 2 and the second insulating member 3 is 1 μm or less, and preferably 0.5 μm or less, it is possible to further improve the corrosion resistance of the first insulating member 2 and the second insulating member 3 to plasma.

According to the manufacturing method for an electrostatic chuck of the present embodiment, since silicon carbide powder and aluminum oxide powder are mixed by using a high pressure homogenization method, homogeneous dispersion can be performed easily by adding only a small amount of a dispersing agent, or without adding a dispersing agent, and it is possible to reduce the intermixture of carbon and various types of metallic impurities caused by impurities such as the dispersing agent or the like.

Accordingly, it is possible to easily obtain an electrostatic chuck in which plasma resistance and corrosion resistance are improved significantly, and the hardness and mechanical strength are high.

Second Embodiment

In an electrostatic chuck of a second embodiment of the present invention, the material composition of the first insulating member 2 constituting the electrostatic chuck 1 is changed from the first embodiment as described above. Points other than this are exactly the same as for the electrostatic chuck 1 of the first embodiment.

A first insulating member according to the present embodiment is manufactured by a composite ceramic having silicon carbide and aluminum oxide as its main constituents, and on the surface of the silicon carbide particles, a film coating comprising a mullite based material with a thickness of, for example, 0.2 μm or less, and preferably 0.1 μm or less, is formed.

For the mullite based material, other than mullite ($3Al_2O_3 \cdot 2SiO_2$), a solid solution or a glassy composite of aluminum oxide and mullite, or a solid solution or glassy composite of silicon dioxide ($SiO_2$) and mullite is preferable.

It is desirable that the thickness of this film coating is 0.2 μm or less. This is because if the thickness exceeds 0.2 μm, the plasma resistance is reduced.

This composite ceramic contains 98 wt % or more of the silicon carbide and aluminum oxide combined, and the content of the silicon carbide in this composite ceramic is preferably 4 to 13 wt %.

The electrical conductivity of this composite ceramic is determined mainly by the silicon carbide, being a semiconductor. Therefore, the possibility is increased that silicon carbide particles in the composite ceramic make direct contact with each other to form conductive paths. For example, in a high silicon carbide content region where the content of silicon carbide is 4 to 13 wt %, by forming an insulating film coating such as a mullite based material or the like on the surface of the silicon carbide particles, it is possible to prevent a sharp drop of the volume resistivity value, so that the volume resistivity value can be controlled easily.

In the electrostatic chuck of the present embodiment, similarly to the electrostatic chuck 1 of the first embodiment, the average particle diameter of the aluminum oxide particles in the composite ceramic constituting the first insulating member is preferably 2 μm or less. Furthermore the average particle diameter of the silicon carbide particles is preferably 1 μm or less, and preferably 0.5 μm or less, and the surface roughness Ra of the mounting surface of this first insulating member is 0.1S or less.

Moreover, it is desirable that at least some of the silicon carbide particles in the composite ceramic constituting the first insulating member are inside the aluminum oxide particles. Furthermore, in this composite ceramic, it is desirable that the content of metallic impurities other than the aluminum and silicon is 0.1 wt % or less.

Here, the second insulating member may be formed from an insulating member having a different structure from the first insulating member. However, it is desirable to form the second insulating member from a composite ceramic having the same structure as the first insulating member, because it enables it to have excellent corrosion resistance to corrosive gases such as halogens and the like, plasma resistance to plasma, high mechanical strength and hardness, and excellent heat resistance and thermal shock resistance. Furthermore it simplifies the manufacturing process of the electrostatic chuck.

A point of difference of the manufacturing method for the electrostatic chuck of the present embodiment from the electrostatic chuck of the first embodiment as described above is that the present embodiment uses, as a raw material, a silicon carbide powder on the surface of which a film coating (also referred to hereunder as oxide film) formed from silicon dioxide is formed by oxidizing the surface.

The content of this silicon carbide powder is preferably 4 to 13 wt %.

Since the volume resistivity value of the composite ceramic is influenced by; the average particle diameter and the thickness of the oxide film of the silicon carbide powder, and the blending rate and the dispersion state of silicon carbide powder and aluminum oxide powder, it is desirable to determine the average particle diameter and the thickness of the oxide film of the silicon carbide powder, and the blending rate and the dispersion state of silicon carbide powder and aluminum oxide powder, in advance experimentally so as to obtain a composite ceramic in which the desired volume resistivity value, that is the volume resistivity value in the temperature range of −200° C. to 200° C., is $1 \times 10^{14}$ Ωcm to $1 \times 10^{16}$ Ωcm.

An example of a method for oxidizing the surface of the silicon carbide particles is a method of heat treating in an atmosphere. For example, heat treatment at a temperature of 350° C. in an atmosphere for 50 hours, or the like. In this manner, it is possible to obtain a surface coated silicon carbide powder with an oxide film with a thickness of 0.2 μm or less, and preferably 0.1 μm or less, on the surface.

Then, this surface coated silicon carbide powder and aluminum oxide powder are mixed by a high pressure homogenization method so as to have a proportion of 4 to 13 wt % of silicon carbide and 96 to 87 wt % of aluminum oxide, and the mixed powder obtained is calcinated under prescribed pressure conditions by using, for example a hot isostatic pressing (HIP) method or the like to form a composite ceramic.

In this pressurized calcination process, firstly silicon dioxide formed on the surface of the silicon carbide particles and aluminum oxide react in the zone where the silicon carbide particles and the aluminum oxide particles make contact, thus creating a mullite based material containing mullite ($3Al_2O_3 \cdot 2SiO_2$) as its main constituent. This mullite based material covers the surface of the silicon carbide particles as the reaction progresses.

As calcination progresses, the silicon carbide particles whose surfaces were covered with a mullite based material, and the aluminum oxide particles, grow in particle size, and joining of the particles progresses via the mullite based material.

When calcination progresses further, pores between the silicon carbide particles and the aluminum oxide particles disappear, thus forming a fine sintered body, that is, the composite ceramic of the present embodiment.

In this manner, it is possible to create an insulating film coating formed from a mullite based material on the surface of the silicon carbide particles, and accordingly, it is possible to prevent a sharp drop in the volume resistivity value.

Here, the atmosphere at the time of calcination of the composite ceramic may be a non-oxidizing atmosphere in order to prevent excess oxidization of the silicon carbide. Other conditions and the like may be the same as in the manufacturing method for the electrostatic chuck of the first embodiment.

The electrostatic chuck and the manufacturing method therefor according to the present embodiment can exhibit the same effects as in the electrostatic chuck and the manufacturing method therefor according to the first embodiment as described above.

Furthermore, since an insulating film coating formed from a mullite based material is formed on the surface of the silicon carbide particles, it is possible to further increase the corrosion resistance to corrosive gases such as halogens and the like, and plasma resistance to plasma.

EXAMPLES

The present invention is described in detail below through examples and comparative examples.

Example 1

An ultrafine silicon carbide powder whose average particle diameter was 0.05 μm was vapor phase synthesized by using a plasma CVD method, and 3 wt % of the ultrafine silicon carbide powder and 97 wt % of aluminum oxide powder whose average particle diameter was 0.5 μm were mixed for two hours by using a high pressure homogenization apparatus (ULTHIMAIZER SYSTEM™, manufactured by Sugino Machine Limited) pressure: $1.52 \times 10^8$ Pa (1500 atmospheres), thus obtaining a mixed powder.

After the obtained mixed powder was dried, it was molded into a discoid shape, then calcinated under pressure at a temperature of 1780° C. in an argon (Ar) atmosphere for three hours by using a hot isostatic pressing method (HIP), thereby producing two discoid shaped composite ceramics with a diameter of 195 mm and a thickness of 4 mm. Here, the applied pressure was 30 MPa.

Next, a through hole with an internal diameter of 5 mm was formed in the central part of one composite ceramic, of the two discoid shaped composite ceramics, by machining, to form a first insulating member. Furthermore, a through hole with an internal diameter of 5 mm was formed in the central part of the other composite ceramic. Moreover, an electrode insertion hole (through hole) with an internal diameter of 10 mm was formed in a location 25 mm away from the central part, by machining, to form a second insulating member.

Next, the region on the surface of the second insulating member, where an electrode was to be formed, for example a region within a radius of 90 mm from the center, was coated with a conductive coating material containing a tantalum carbide powder (30 vol %) and an aluminum oxide powder (70 vol %) by a screen printing method, to form a conductive material layer. Furthermore, an annular region on the surface of this second insulating member, which was outside the region where the conductive material layer was formed, for example an annular region with a radius of 90 to 97.5 mm, was coated with an insulating coating material containing an aluminum oxide powder, by screen printing to form an insulating material layer.

Next, the surface of the first insulating member, on the side joining the second insulating member, was ground by 1.3 mm, a electrode formed from tantaum carbide was inserted into the electrode insertion hole of the second insulating member, and afterwards the first insulating member and the second insulating member were superposed via the conductive material layer and the insulation material layer and pressurized to 5 MPa while heating to 1700° C. By this pressurized calcination, the conductive material layer was calcinated to form an internal electrode, the insulation material layer being calcinated to form an insulating layer, and thus the first insulating member and the second insulating member were joined and united via the internal electrode and the insulating layer.

Next, the mounting surface of the first insulating member was polished by a normal polishing method so as to have a surface roughness Ra of 0.004 S, to form an electrostatic chuck of example 1.

Example 2

In example 2, an electrostatic chuck was manufactured in the same manner as in example 1. However, instead of the ultrafine silicon carbide powder in example 1, a surface coated ultrafine silicon carbide powder whose surface was oxidized by holding the ultrafine silicon carbide powder in example 1 at a temperature of 350° C. in air for 50 hours was used. Furthermore the blending proportion of this surface coated ultrafine silicon carbide powder was 10 wt %, and the blending proportion of the aluminum oxide powder was 90 wt %.

A film coating of silicon dioxide, with a thickness of 0.005 µm, was formed on this surface coated ultrafine silicon carbide powder.

Comparative Example 1

In comparative example 1, an electrostatic chuck was manufactured in the same manner as in example 1. However, for a first insulating member and a second insulating member, an alumina ceramic, of 100% of aluminum oxide ($Al_2O_3$) was used. Furthermore, the mounting surface of the first insulating member was polished so as to have a surface roughness Ra of 0.05S.

Comparative Example 2

In comparative example 2, an electrostatic chuck was manufactured in the same manner as in example 1. However, the blending proportions of ultrafine silicon carbide powder and aluminum oxide powder were 7 wt % of ultrafine silicon carbide powder and 93 wt % of aluminum oxide powder.
(Evaluation)
The following evaluations were performed on the electrostatic chucks of examples 1 and 2 and comparative examples 1 and 2 manufactured in the above manner.
(1) Evaluation of Composite Ceramic
The volume resistivity values of the composite ceramics used in the electrostatic chucks in examples 1 and 2 and comparative examples 1 and 2 at prescribed temperatures were measured according to a usual method. There were five measurement temperature points of −180° C., −100° C., 25° C., 100° C. and 180° C.

Furthermore, the average particle diameters of the aluminum oxide particles and the silicon carbide particles in the composite ceramics were measured by using a scanning electron microscope (SEM).

Moreover, when the composite ceramics in examples 1 and 2 were observed using the SEM, some of the silicon carbide particles were observed to be inside the aluminum oxide particles. Furthermore, in the composite ceramic of example 2, it was identified by observation using a transmission electron microscope (TEM) that mullite ($3Al_2O_3 \cdot 2SiO_2$) with a thickness of 0.007 µm was created on the surface of the silicon carbide particles. The measurement results are shown in Table 1.

TABLE 1

|  | Volume Resistivity Value (Ω cm) | | | | | Aluminum Oxide Particle Diameter (µm) | Silicon Carbide Particle Diameter (µm) |
| --- | --- | --- | --- | --- | --- | --- | --- |
|  | −180° C. | −100° C. | 25° C. | 100° C. | 180° C. |  |  |
| Example 1 | $8 \times 10^{15}$ | $3 \times 10^{15}$ | $9 \times 10^{14}$ | $5 \times 10^{14}$ | $1 \times 10^{14}$ | 1.0 | 0.1 |
| Example 2 | $7 \times 10^{15}$ | $2 \times 10^{15}$ | $8 \times 10^{14}$ | $6 \times 10^{14}$ | $2 \times 10^{14}$ | 1.0 | 0.1 |
| Comparative Example 1 | $9 \times 10^{14}$ | $7 \times 10^{14}$ | $4 \times 10^{14}$ | $2 \times 10^{14}$ | $8 \times 10^{13}$ | 10.0 | — |
| Comparative Example 2 | $7 \times 10^{13}$ | $3 \times 10^{13}$ | $6 \times 10^{12}$ | $5 \times 10^{11}$ | $3 \times 10^{10}$ | 1.5 | 0.1 |

(2) Evaluation of Electrostatic Attraction Characteristics

Electrostatic attraction force, attraction time, and disattachment time of the electrostatic chucks in examples 1 and 2 and comparative examples 1 and 2 were measured at a temperature of 25° C. For the plate specimen used for the measurement, an Si wafer with a diameter of 203.2 mm on the surface of which an oxide film was not formed, and an Si wafer with the same diameter on the surface of which an oxide film with a thickness of 2 µm was formed, were used.

Table 2 shows the measurement results of the Si wafer on which an oxide film was not formed, and Table 3 the measurement results of the Si wafer on which an oxide film was formed.

The measuring method and measuring apparatus for the electrostatic attraction characteristics will be described later.

(3) Evaluation of Electrostatic Attraction Characteristics after Plasma Exposure The electrostatic chucks in examples 1 and 2 and comparative examples 1 and 2 were mounted in a plasma CVD machine, and after plasma exposure was performed on the electrostatic chucks for 20 hours in a mixed gas atmosphere of $CF_4$ 20 vol % and $O_2$ 80 vol %, with a pressure of $1.33 \times 10^2$ Pa (1.0Torr) and a temperature of 50° C., the electrostatic attraction characteristics were evaluated in the same manner as above.

Table 2 shows the measurement results of the Si wafer on which an oxide film was not formed, and Table 3 the measurement results of the Si wafer on which an oxide film was formed.

TABLE 2

| | Before Plasma Exposure | | | After Plasma Exposure | | |
|---|---|---|---|---|---|---|
| | Electrostatic Attraction force (kPa) | Attraction Time (s) | Detachment Time (s) | Electrostatic Attraction force (kPa) | Attraction Time (s) | Detachment Time (s) |
| Example 1 | 25 | 2 | 2 | 25 | 2 | 2 |
| Example 2 | 25 | 2 | 2 | 25 | 2 | 2 |
| Comparative Example 1 | 25 | 2 | 2 | 15 | 2 | 2 |
| Comparative Example 2 | 50 | 5 | 20 | 45 | 5 | 10 |

TABLE 3

| | Before Plasma Exposure | | | After Plasma Exposure | | |
|---|---|---|---|---|---|---|
| | Electrostatic Attraction force (kPa) | Attraction Time (s) | Detachment Time (s) | Electrostatic Attraction force (kPa) | Attraction Time (s) | Detachment Time (s) |
| Example 1 | 25 | 2 | 2 | 25 | 2 | 2 |
| Example 2 | 25 | 2 | 2 | 25 | 2 | 2 |
| Comparative Example 1 | 25 | 2 | 2 | 15 | 2 | 2 |
| Comparative Example 2 | 60 | 15 | 30 | 45 | 10 | 30 |

(4) Evaluation of Surface Roughness

The surface roughness Ra of the mounting surface of the electrostatic chucks of examples 1 and 2 and comparative examples 1 and 2 before and after plasma exposure was measured by using a typical commercial surface roughness measuring instrument. The measurement results are shown in Table 4.

TABLE 4

| | Surface Roughness ($\mu$m) | |
|---|---|---|
| | Before Plasma Exposure | After Plasma Exposure |
| Example 1 | 0.004 | 0.006 |
| Example 2 | 0.004 | 0.006 |
| Comparative Example 1 | 0.05 | 0.5 |
| Comparative Example 2 | 0.004 | 0.006 |

(Measuring Method and Measuring Apparatus for Electrostatic Attraction Characteristics) characteristics of an electrostatic chuck, and the measuring apparatus used at the time of this measurement.

Figure 4:
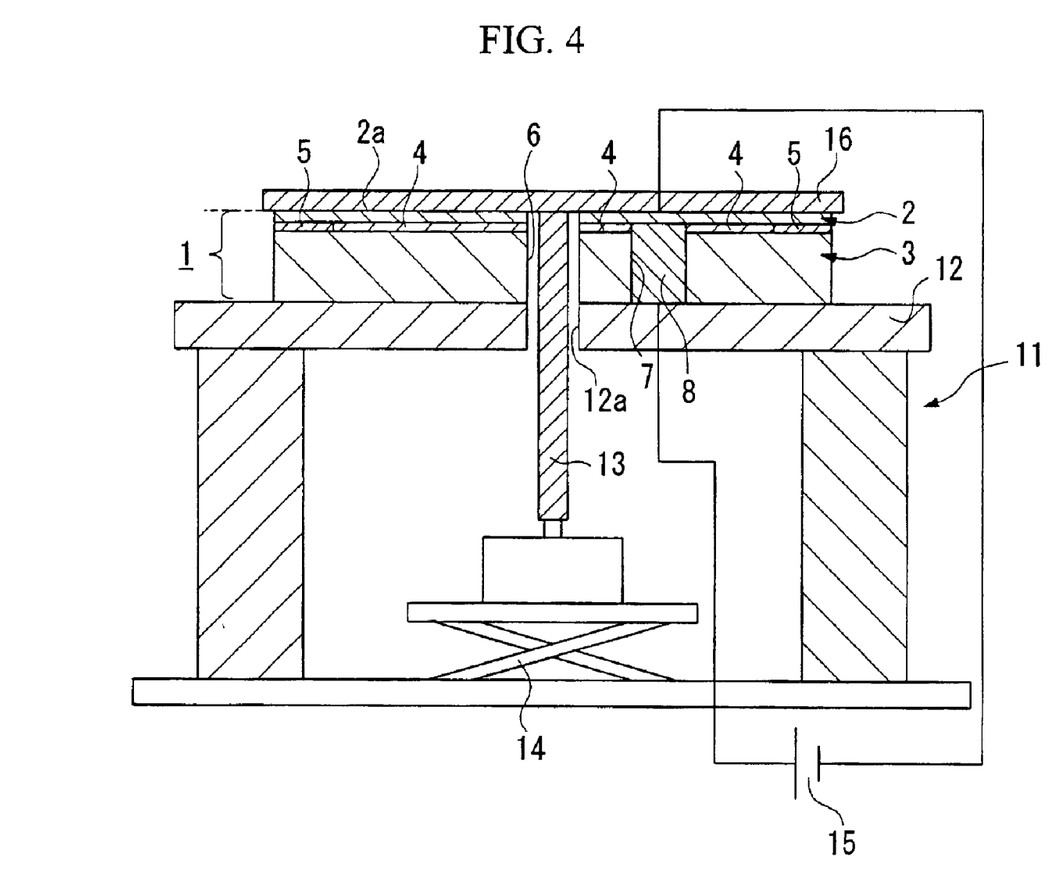
FIG. 4 is a cross-sectional view showing an apparatus for measuring electrostatic attraction characteristics.

FIG. 4 is a cross-sectional view showing the measuring apparatus for the electrostatic attraction characteristics. This measuring apparatus 11 comprises as its main components: an electrostatic chuck stage 12 in the central part of which a through hole 12a is formed; a cylinder shaped pushing member 13 which is capable of being freely inserted through this through hole 12a; a lifter 14, which moves this pushing member 13 in the vertical direction and holds it in a desired position in the vertical direction; and a power supply 15 for applying DC voltage.

Next is a description of a method for measuring the electrostatic attraction characteristics of a plate specimen by using this measuring apparatus 11. Here, a Si wafer 16 is used in the description, as an example of a plate specimen.

Firstly, this electrostatic chuck 1 was mounted on the electrostatic chuck stage 12 such that the location of the through hole 6 corresponded to the location of the through hole 12a of the electrostatic chuck stage 12.

Next, after the pushing member 13 was inserted through the through hole 6 in the electrostatic chuck 1 and the through hole 12a in the electrostatic chuck stage 12, the Si wafer 16 was mounted on the mounting surface 2a of the electrostatic chuck 1.

Next, by moving the lifter 14 upward, the pushing member 13 was moved upward, and the upper end of this pushing member 13 came into contact with the lower surface of the Si wafer 16.

With this situation maintained, a prescribed DC voltage was applied between the mounting surface 2a of the electrostatic chuck 1 and the electrode 8, by the power supply 15 at a temperature of 20° C., and the Si wafer 16 was electrostatically attached to the electrostatic chuck 1. The DC voltage applied was 2000V in examples 1 and 2 and comparative example 1, and 500V in comparative example 2.

After this electrostatically attached state had been maintained for 5 minutes, the DC voltage was removed.

Afterwards, by moving the lifter 14 upwards, the pushing member 13 was pushed upwards, and the Si wafer 16 was disattached from the mounting surface 2a. The force required for this disattachment was measured by a load cell, and designated the electrostatic attraction force.

Furthermore, the attraction time was the time from when the DC voltage of 2000V in examples 1 and 2 and comparative example 1, and 500V in comparative example 2, was applied between the mounting surface 2a of the electrostatic chuck 1 and the electrode 8, to when the electrostatic attraction force of the electrostatic chuck 1 reached $9.8 \times 10^4$ Pa (100 gf/cm$^2$). The DC voltage was removed after the DC voltage of 2000V in examples 1 and 2 and comparative example 1, and 500V in comparative example 2, was applied between the mounting surface 2a of the electrostatic chuck 1 and the electrode 8 for 5 minutes, and the disattachment time was the time from when this voltage was removed to when the electrostatic attraction force of the electrostatic chuck 1 reached $9.8 \times 10^3$ Pa (100 gf/cm$^2$).

According to Table 1, the volume resistivity values of the first insulating members of the electrostatic chucks of examples 1 and 2 were $1 \times 10^{14}$ Ωcm to $1 \times 10^{16}$ Ωcm in the temperature range of −180° C. to 180° C. Therefore it was confirmed that the insulation was good. As a result, it was found that for the electrostatic forces exhibited, the Coulomb force was dominant, and no leakage current occurred.

On the other hand, some volume resistivity values of the first insulating members of the electrostatic chucks of comparative examples 1 and 2 were below $1 \times 10^{14}$ Ωcm in the temperature range −180° C. to 180° C., which shows that the insulation was insufficient. As a result, the leakage current was determined to be large.

Furthermore, Table 2 and Table 3 show that the electrostatic chucks of examples 1 and 2 had no change in their electrostatic attraction force, attraction time, and disattachment time, regardless of the type of plate specimen (Si wafer without oxide film, or Si wafer with oxide film) before and after plasma exposure.

On the other hand, the electrostatic chuck of comparative example 1 was not inferior to examples 1 and 2 before plasma exposure regardless of the type of plate specimen, however, after plasma exposure, the electrostatic attraction force dropped significantly.

Moreover, in the electrostatic chuck of comparative example 2, it was found that the electrostatic attraction force, attraction time and disattachment time varied depending on the type of plate specimen, and the electrostatic attraction force dropped significantly after plasma exposure.

Furthermore, Table 4 shows that there was a change in the surface roughness Ra in the electrostatic chuck of comparative example 1, while there was no change in the surface roughness Ra in the electrostatic chucks of examples 1 and 2.

From above, it was found that the plasma resistance and corrosion resistance of the electrostatic chucks of examples 1 and 2 were improved significantly.

As described above, according to the electrostatic chuck of the present invention, since a first insulating member on which a plate specimen is mounted is a composite ceramic having as its main constituents 1 wt % to 4 wt % of silicon carbide (SiC), and aluminum oxide ($Al_2O_3$), with a volume resistivity value in the temperature range of −200° C. to 200° C., of $1 \times 10^{14}$ Ωcm to $1 \times 10^{16}$ Ωcm, then of the electrostatic forces for attracting and holding a plate specimen, the Coulomb force is dominant over the Johnson-Rahbek effect, charging up of the attachment surface can be prevented when plasma processing is performed, plasma resistance can be improved significantly, and corrosion resistance can also be improved.

According to the other electrostatic chuck of the present invention, since the first insulating member is formed from a composite ceramic having as its main constituents silicon carbide, on the surface of which an insulating material is formed, and aluminum oxide, with a volume resistivity value in the temperature range of −200° C. to 200° C., of $1 \times 10^{14}$ Ωcm to $1 \times 10^{16}$ Ωcm, then of the electrostatic forces for attracting and holding a plate specimen, the Coulomb force is dominant over the Johnson-Rahbek effect, charging up of the attachment surface can be prevented when plasma processing is performed, plasma resistance can be improved significantly, and corrosion resistance can also be improved.

According to the manufacturing method for the electrostatic chuck of the present invention, since prescribed amounts of silicon carbide powder and aluminum oxide powder are both weighed, and mixed by a high pressure homogenization method, it is easily possible to disperse them homogeneously even if there is only a small amount of silicon carbide powder, thus enabling a mixed powder with excellent homogenous composition to be obtained. Accordingly, by pressurizing and calcinating this mixed powder, it is possible to obtain a composite ceramic that has no abnormal particle growth, substantially no intermixed impurities such as carbon or a range of metallic impurities caused by a dispersing agent, and that has an excellent homogeneous composition.

What is claimed is:

1. An electrostatic chuck comprising: a first insulating member whose one principal plane serves as a mounting surface on which a plate specimen is mounted; a second insulating member, which is positioned facing an other principal plane of said first insulating member; and an internal electrode located between said first insulating member and said second insulating member, wherein
said first insulating member is formed from a composite ceramic having as its main constituents 1 wt % to 4 wt % of silicon carbide, and aluminum oxide, with a volume resistivity value over a temperature range of −200° C. to 200° C., of $1 \times 10^{14}$ Ωcm to $1 \times 10^{16}$ Ωcm.

2. An electrostatic chuck according to claim 1, wherein an average particle diameter of aluminum oxide particles in said composite ceramic is 2 μm or less.

3. An electrostatic chuck according to claim 1, wherein an average particle diameter of silicon carbide particles in said composite ceramic is 1 μm or less.

4. An electrostatic chuck according to claim 1, wherein at least some of the silicon carbide particles in said composite ceramic are inside aluminum oxide particles.

5. An electrostatic chuck comprising: a first insulating member whose one principal plane serves as a mounting surface on which a plate specimen is mounted; a second insulating member, which is positioned facing an other principal plane of said first insulating member; and an internal electrode located between said first insulating member and said second insulating member, wherein
said first insulating member is formed from a composite ceramic having as its main constituents silicon carbide, on the surface of which an insulating material is formed, and aluminum oxide, with a volume resistivity value over a temperature range of −200° C. to 200° C., of. $1 \times 10^{14}$ Ωcm to $1 \times 10^{16}$ Ωcm.

6. An electrostatic chuck according to claim 5, wherein said insulating material is a mullite based material.

7. An electrostatic chuck according to claim 6, wherein a thickness of said mullite based material is 0.2 μm or less.

8. An electrostatic chuck according to claim 5, wherein an average particle diameter of the aluminum oxide particles in said composite ceramic is 2 μm or less.

9. An electrostatic chuck according to claim 5, wherein an average particle diameter of the silicon carbide particles in said composite ceramic is 1 μm or less.

10. An electrostatic chuck according to claim 5, wherein at least some of the silicon carbide particles in said composite ceramic are inside aluminum oxide particles.

* * * * *